US011978622B2

(12) United States Patent
Song et al.

(10) Patent No.: US 11,978,622 B2
(45) Date of Patent: May 7, 2024

(54) AQUEOUS AND SEMI-AQUEOUS CLEANERS FOR THE REMOVAL OF POST-ETCH RESIDUES WITH TUNGSTEN AND COBALT COMPATIBILITY

(71) Applicant: Entegris, Inc., Billerica, MA (US)

(72) Inventors: Lingyan Song, Danbury, CT (US); Steven Lippy, Brookfield, CT (US); Emanuel I. Cooper, Scarsdale, NY (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 15/324,588

(22) PCT Filed: Jun. 24, 2015

(86) PCT No.: PCT/US2015/037457
§ 371 (c)(1),
(2) Date: Jan. 6, 2017

(87) PCT Pub. No.: WO2016/003729
PCT Pub. Date: Jan. 7, 2016

(65) Prior Publication Data
US 2017/0200601 A1 Jul. 13, 2017

Related U.S. Application Data

(60) Provisional application No. 62/018,818, filed on Jun. 30, 2014.

(51) Int. Cl.
H01L 21/02 (2006.01)
B08B 3/08 (2006.01)
C11D 1/00 (2006.01)
C11D 1/66 (2006.01)
C11D 3/04 (2006.01)
C11D 3/24 (2006.01)
C11D 3/30 (2006.01)
C11D 3/36 (2006.01)
C11D 3/37 (2006.01)
C11D 3/43 (2006.01)
C11D 7/08 (2006.01)
C11D 7/10 (2006.01)
C11D 7/28 (2006.01)
C11D 11/00 (2006.01)

(52) U.S. Cl.
CPC .......... *H01L 21/02068* (2013.01); *B08B 3/08* (2013.01); *C11D 1/008* (2013.01); *C11D 1/667* (2013.01); *C11D 3/042* (2013.01); *C11D 3/046* (2013.01); *C11D 3/245* (2013.01); *C11D 3/30* (2013.01); *C11D 3/361* (2013.01); *C11D 3/3707* (2013.01); *C11D 3/43* (2013.01); *C11D 7/08* (2013.01); *C11D 7/10* (2013.01); *C11D 7/28* (2013.01); *C11D 11/0047* (2013.01); *H01L 21/02063* (2013.01)

(58) Field of Classification Search
CPC ..... H01L 21/02068; C11D 3/361; C11D 3/30; C11D 3/43; C11D 3/046; C11D 11/0047; C11D 3/042; C11D 3/245; C11D 1/667; B08B 3/08
USPC ........... 510/175, 176; 134/26, 1.3; 252/79.1, 252/79.3
See application file for complete search history.

(56) References Cited

U.S. PATENT DOCUMENTS

| | | | |
|---|---|---|---|
| 5,849,220 A * | 12/1998 | Batton | C23F 11/128 252/396 |
| 6,224,785 B1 * | 5/2001 | Wojtczak | C11D 7/3281 257/E21.228 |
| 6,635,118 B2 | 10/2003 | Sachdev et al. | |
| 6,698,619 B2 | 3/2004 | Wertenberger | |
| 7,188,644 B2 | 3/2007 | Kelly et al. | |
| 7,723,280 B2 * | 5/2010 | Brainard | G03F 7/426 510/175 |
| 9,063,431 B2 * | 6/2015 | Barnes | G03F 7/42 |
| 10,176,979 B2 * | 1/2019 | Liu | C11D 3/3409 |
| 2003/0181342 A1 * | 9/2003 | Seijo | G03F 7/425 510/499 |
| 2006/0154839 A1 * | 7/2006 | Ilardi | C11D 3/0073 510/175 |
| 2006/0172906 A1 * | 8/2006 | Wu | C11D 7/3209 510/175 |
| 2008/0004197 A1 | 1/2008 | Kneer | |
| 2008/0006305 A1 * | 1/2008 | Bernhard | C11D 3/43 510/176 |
| 2009/0203566 A1 | 8/2009 | Lee | |
| 2009/0215658 A1 | 8/2009 | Minsek et al. | |

(Continued)

FOREIGN PATENT DOCUMENTS

| | | |
|---|---|---|
| CN | 1656206 A | 8/2005 |
| CN | 102131911 A | 7/2011 |

(Continued)

OTHER PUBLICATIONS

U.S. Appl. No. 60/916,966, filed Nov. 20, 2008.

Primary Examiner — Duy Vu N Deo
Assistant Examiner — Christopher Remavege

(57) ABSTRACT

Cleaning compositions and processes for cleaning post-plasma etch residue from a microelectronic device having said residue thereon. The composition achieves highly efficacious cleaning of the residue material, including titanium-containing, copper-containing, tungsten-containing, and/or cobalt-containing post-etch residue from the microelectronic device while simultaneously not damaging the interlevel dielectric, metal interconnect material, and/or capping layers also present thereon.

13 Claims, No Drawings

(56) References Cited

U.S. PATENT DOCUMENTS

| | | | |
|---|---|---|---|
| 2009/0301996 A1* | 12/2009 | Visintin | C11D 3/0073 |
| | | | 216/13 |
| 2010/0105595 A1 | 4/2010 | Lee | |
| 2010/0112728 A1* | 5/2010 | Korzenski | C09K 13/08 |
| | | | 438/3 |
| 2010/0163788 A1 | 7/2010 | Visintin et al. | |
| 2011/0237480 A1* | 9/2011 | Mizutani | C11D 7/265 |
| | | | 510/175 |
| 2012/0283163 A1* | 11/2012 | Barnes | H01L 21/02074 |
| | | | 510/175 |
| 2013/0296214 A1 | 11/2013 | Barnes et al. | |
| 2014/0137899 A1* | 5/2014 | Peters | G03F 7/425 |
| | | | 134/26 |
| 2014/0235064 A1* | 8/2014 | Matsui | C09K 13/08 |
| | | | 252/79.3 |
| 2015/0315712 A1* | 11/2015 | Hawes | C11D 11/0029 |
| | | | 510/257 |
| 2016/0130500 A1* | 5/2016 | Chen | C11D 3/30 |
| | | | 216/13 |

FOREIGN PATENT DOCUMENTS

| | | | | |
|---|---|---|---|---|
| TW | 201028466 A | 8/2010 | | |
| TW | 201336973 A | 9/2013 | | |
| WO | 2008/141206 A2 | 11/2008 | | |
| WO | WO 2012009639 A2 * | 1/2012 | | H01L 21/02063 |
| WO | 2016/003729 A1 | 1/2016 | | |

* cited by examiner

AQUEOUS AND SEMI-AQUEOUS CLEANERS FOR THE REMOVAL OF POST-ETCH RESIDUES WITH TUNGSTEN AND COBALT COMPATIBILITY

FIELD

The present invention relates to compositions for the removal of post-etch residue, including titanium-containing, cobalt-containing, tungsten-containing and/or copper-containing post-etch residue, from microelectronic devices and methods of making and using the same.

DESCRIPTION OF THE RELATED ART

Interconnect circuitry in semiconductor circuits consists of conductive metallic circuitry surrounded by insulating dielectric material. In the past, silicate glass vapor-deposited from tetraethylorthosilicate (TEOS) was widely used as the dielectric material, while alloys of aluminum were used for metallic interconnects. Demand for higher processing speeds has led to smaller sizing of circuit elements, along with the replacement of TEOS and aluminum alloys by higher performance materials. Aluminum alloys have been replaced by copper or copper alloys due to the higher conductivity of copper. TEOS and fluorinated silicate glass (FSG) have been replaced by the so-called low-k dielectrics, including low-polarity materials such as organic polymers, hybrid organic/inorganic materials, organosilicate glass (OSG), and carbon-doped oxide (CDO) glass. The incorporation of porosity, i.e., air-filled pores, in these materials further lowers the dielectric constant of the material.

During dual-damascene processing of integrated circuits, photolithography is used to image a pattern onto a device wafer. Photolithography techniques comprise the steps of coating, exposure, and development. A wafer is coated with a positive or negative photoresist substance and subsequently covered with a mask that defines patterns to be retained or removed in subsequent processes. Following the proper positioning of the mask, the mask has directed therethrough a beam of monochromatic radiation, such as ultraviolet (UV) light or deep UV (DUV) light (≈250 nm or 193 nm), to make the exposed photoresist material more or less soluble in a selected rinsing solution. The soluble photoresist material is then removed, or "developed," leaving behind a pattern identical to the mask.

Thereafter, gas-phase plasma etching is used to transfer the patterns of the developed photoresist coating to the underlying layers, which may include hardmask, interlevel dielectric (ILD), and/or etch stop layers. Post-plasma etch residues are typically deposited on the back-end-of-the-line (BEOL) structures and if not removed, may interfere with subsequent silicidation or contact formation. Post-plasma etch residues typically include chemical elements present on the substrate and in the plasma gases. For example, if a TiN hardmask is employed, e.g., as a capping layer over ILD, the post-plasma etch residues include titanium-containing species, which are difficult to remove using conventional wet cleaning chemistries. Moreover, conventional cleaning chemistries often damage the ILD, absorb into the pores of the ILD thereby increasing the dielectric constant, and/or corrode the metal structures. For example, buffered fluoride and solvent-based chemistries fail to completely remove Ti-containing residues, while hydroxylamine-containing and ammonia-peroxide chemistries corrode copper.

In addition to the desirable removal of titanium-containing post-plasma etch residue, additional materials that are deposited during the post-plasma etch process such as polymeric residues on the sidewalls of the patterned device, copper-containing residues in the open via structures of the device, and cobalt-containing and/or tungsten-containing residues are also preferably removed. To date, no single wet cleaning composition has successfully removed all of residue material while simultaneously being compatible with the ILD, other low-k dielectric materials, and metal interconnect materials.

The integration of new materials, such as low-k dielectrics, into microelectronic devices places new demands on cleaning performance. At the same time, shrinking; device dimensions reduce the tolerance for changes in critical dimensions and damage to device elements. Etching conditions can be modified in order to meet the demands of the new materials. Likewise, post-plasma etch cleaning compositions must be modified. The cleaner should not damage the underlying dielectric material or corrode metallic interconnect materials, e.g., copper, tungsten, cobalt, aluminum, ruthenium, titanium and nitrides and silicides thereof, on the device.

Towards that end, it is an object of the present invention to provide compositions and methods for the effective removal of post-plasma etch residue including, but not limited to, titanium-containing residue, polymeric sidewall residue, copper-containing via residue, tungsten-containing residue, and/or cobalt-containing residue from microelectronic devices, said compositions being compatible with IUD, metal interconnect materials, and/or capping layers.

SUMMARY

The present invention generally relates to cleaning compositions and methods of making and using same. One aspect of the invention relates to a composition and process for cleaning post-plasma etch residue from microelectronic devices having said residue thereon, while simultaneously not compromising the metallic and ILD materials on the microelectronic device surface.

In one aspect, an aqueous cleaning composition is described, said aqueous cleaning composition comprising at least one non-ionic surfactant corrosion inhibitor, at least one etchant source, at least one passivating agent, water, optionally at least one organic solvent, optionally at least one buffering species, optionally at least one additional corrosion inhibitor, and optionally at least one oxidizing agent, wherein said aqueous cleaning composition is suitable for cleaning post-plasma etch residue from a microelectronic device having said residue thereon.

In another aspect, a method of removing material from a microelectronic device having said material thereon is described, said method comprising contacting the microelectronic device with an aqueous cleaning composition for sufficient time to at least partially remove said material from the microelectronic device, wherein said aqueous cleaning composition comprises least one non-ionic surfactant corrosion inhibitor, at least one etchant source, at least one passivating agent, water, optionally at least one organic solvent, optionally at least one buffering species, optionally at least one additional corrosion inhibitor, and optionally at least one oxidizing agent.

Other aspects, features and advantages of the invention will be more fully apparent from the ensuing disclosure and appended claims.

DETAILED DESCRIPTION, AND PREFERRED EMBODIMENTS THEREOF

The present invention generally relates to compositions for removing residue, preferably post-etch residue, more preferably titanium-containing post-etch residue, polymeric sidewall residue, cobalt-containing post-etch residue, copper-containing; via and line residue and/or tungsten-containingpost-etch residue from microelectronic devices having said residue thereon, said compositions preferably being compatible with ultra low-k (ULK) ILD materials, such as OSG and porous-CDO, the metallic interconnect materials, e.g., copper, and tungsten, the hardmask capping layers, e.g., TiN, and cobalt capping layers, e.g., CoWP, on the microelectronic device surface. Further, the present invention generally relates to methods of removing residue, preferably post-etch residue, more preferably titanium-containing post-etch residue, polymeric sidewall residue, copper-containing via and line residue, tungsten-containing post-etch residue, and/or cobalt-containing post-etch residue, from microelectronic devices having said residue thereon, using compositions, said compositions preferably being compatible with ultra low-k (ULK) ILD materials, the metallic interconnect materials, and the capping layers, on the microelectronic device surface.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the term "microelectronic device" is not meant to be limiting in any way and includes any substrate or structure that will eventually become a microelectronic device or microelectronic assembly. Notably, the microelectronic device substrate may be patterned, blanketed and/or a test substrate.

"Post-etch residue" and "post-plasma etch residue," as used herein, corresponds to material remaining following gas-phase plasma etching processes, e.g., BEOL dual-damascene processing. The post-etch residue may be organic, organometallic, organosilicic, or inorganic in nature, for example, silicon-containing material, titanium-containing material, nitrogen-containing material, oxygen-containing material, polymeric residue material, copper-containing residue material (including copper oxide residue), tungsten-containing residue material, cobalt-containing residue material, etch gas residue such as chlorine and fluorine, and combinations thereof.

As defined herein, "low-k dielectric material" and ULK corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. Most preferably, the low-k dielectric material is deposited using organosilane and/or organosiloxane precursors. It is to be appreciated that the low-k dielectric materials may have varying densities and varying porosities.

As defined herein, the term "polymeric sidewall residue" corresponds to the residue that remains on the sidewalls of the patterned device subsequent to post-plasma etching processes. The residue is substantially polymeric in nature however, it should be appreciated that inorganic species, e.g., titanium, silicon, tungsten, cobalt and/or copper-containing species, may be present in the sidewall residue as well.

As used herein, "about" is intended to correspond to ±5% of the stated value.

As used herein, "suitability" for cleaning post-etch residue from a microelectronic device having said residue thereon corresponds to at least partial removal of said residue from the microelectronic device. Preferably, at least about 90% of one or more of the materials, more preferably at least 95% of one or more of the materials, and most preferably at least 99% of one or more of the materials to be removed are removed from the microelectronic device.

"Capping layer" as used herein corresponds to materials deposited over dielectric material and/or metal material, e.g., cobalt, to protect same during the plasma etch step. Hardmask capping layers are traditionally silicon, silicon nitrides, silicon oxynitrides, titanium nitride, titanium oxynitride, titanium, tantalum, tantalum nitride, molybdenum, tungsten, combinations thereof, and other similar compounds. Cobalt capping layers include CoWP and other cobalt-containing materials or tungsten-containing materials.

As defined herein, "metallic interconnect materials" include, but are not limited to, copper, tungsten, cobalt, aluminum, ruthenium, titanium, and nitrides and silicides thereof "Substantially devoid" is defined herein as less than 2 wt. %, preferably less than 1 wt. %, more preferably less than 0.5 wt. %, and most preferably less than 0.1 wt. %.

As used herein, the term "semi-aqueous" refers to a mixture of water and organic components.

As defined herein, an "alkali and alkaline earth metal hydroxide salt" includes LiOH, NaOH, KOH, RhOH, CsOH, $Mg(OH)_2$, $Ca(OH)_2$, $Sr(OH)_2$ and $Ba(OH)_2$.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

Titanium-containing post-etch residue materials are notoriously difficult to remove using the ammonia-containing compositions of the prior art. The present inventors discovered a cleaning composition that is substantially devoid of ammonia and/or alkali and alkaline earth metal hydroxide salts (e.g., NaOH, KOH, etc.) which effectively and selectively remove titanium-containing residues from the surface of a microelectronic device having same thereon. In addition, the composition will substantially remove polymeric sidewall residue, copper-containing residue, cobalt-containing residue, and/or tungsten-containing residue without substantially damaging the underlying ILD, metal interconnect materials, e.g., Cu, Al, Co and W, and/or the capping layers. Further, the compositions may be used regardless of whether the trench or via is etched first (i.e., a trench-first or via-first scheme).

In a first aspect, a first cleaning composition is described, wherein the first cleaning composition is aqueous or semi-aqueous and comprises, consists of, or consists essentially of at least one corrosion inhibitor, at least one etchant source, at least one passivating agent, water, optionally at least one organic solvent, optionally at least one buffering species, and optionally at least one oxidizing agent, for removing post-plasma etch residues from the surface of a microelectronic device having same thereon, wherein the post-plasma etch residue comprises a species selected from the group consisting of titanium-containing residues, polymeric residues, copper-containing residues, tungsten-containing residues, cobalt-containing residues, and combinations thereof. In another embodiment, the first cleaning composition comprises, consists of, or consists essentially of at least one corrosion inhibitor, at least one etchant source, at least one passivating agent, water, at least one organic solvent, optionally at least one buffering species, and optionally at least one oxidizing agent. In yet another embodiment, the first cleaning composition comprises, consists of, or consists essentially of at least one non-ionic surfactant corrosion inhibitor, at least one etchant source, at least one passivating agent, water, optionally at least one organic solvent, optionally at least one buffering species, optionally at least one additional corrosion inhibitor, and optionally at least one oxidizing agent. In still another embodiment, the first cleaning composition is aqueous or semi-aqueous and comprises, consists of, or consists essentially of at least one non-ionic surfactant corrosion inhibitor, at least one etchant source, at least one passivating agent, water, at least one organic solvent, optionally at least one buffering species, optionally at least one additional corrosion inhibitor, and optionally at least one oxidizing agent. In yet another embodiment, the first cleaning composition comprises, consists of, or consists essentially of at least one non-ionic surfactant corrosion inhibitor, at least one etchant source, at least one passivating agent, water, at least one additional corrosion inhibitor, optionally at least one buffering species, optionally at least one organic solvent, and optionally at least one oxidizing agent. In still another embodiment, the first cleaning composition comprises, consists of, or consists essentially of at least one non-ionic surfactant corrosion inhibitor, at least one etchant source, at least one passivating agent, water, at least one additional corrosion inhibitor, at least one organic solvent, optionally at least one buffering species, and optionally at least one oxidizing agent. Preferably, the amount of water present is in a range from about 50 wt % to about 99.5 wt %, based on the total weight of the composition. The pH range of the first cleaning composition is 4 to 14, preferably about 6 to about 14, even more preferably about 6 to about 10 or about 8 to about 13.

In one embodiment, the first cleaning composition for cleaning post-plasma etch residues selected from the group consisting of titanium-containing residues, polymeric residues, copper-containing residues, tungsten-containing residues, cobalt-containing residues, and combinations thereof, comprises, consists of, or consists essentially of at least one corrosion inhibitor, at least one etchant source, at least one passivating agent, water, optionally at least one organic solvent, optionally at least one buffering species, and optionally at least one oxidizing agent, present in the following ranges, based on the total weight of the composition.

| component | % by weight |
| --- | --- |
| corrosion inhibitor(s) | about 0.001% to about 10% |
| water | about 50% to about 99.5% |
| etchant source(s) | about 0.01% to about 10 wt. % |
| passivating agent(s) | about 0.01% to about 10% |
| buffering species | 0 to about 20 wt % |
| organic solvent(s) | 0 to about 20% |
| oxidizing agent(s) | 0 to about 1% |

In one embodiment, the first cleaning composition for cleaning post-plasma etch residues selected from the group consisting of titanium-containing residues, polymeric residues, copper-containing residues, tungsten-containing residues, cobalt-containing residues, and combinations thereof, comprises, consists of, or consists essentially of at least one non-ionic surfactant corrosion inhibitor, at least one etchant source, at least one passivating agent, water, optionally at least one organic solvent, optionally at least one buffering species, optionally at least one additional corrosion inhibitor, and optionally at least one oxidizing agent, present in the following ranges, based on the total weight of the composition.

| component | % by weight |
| --- | --- |
| non-ionic surfactant corrosion inhibitor(s) | about 0.001% to about 10% |
| water | about 50% to about 99.5% |
| etchant source(s) | about 0.01% to about 10 wt. % |
| passivating agent(s) | about 0.01% to about 10% |
| buffering species | 0 to about 20 wt % |
| organic solvent(s) | 0 to about 20% |
| additional corrosion inhibitor(s) | 0 to about 10% |
| oxidizing agents | 0 to about 1% |

In the broad practice, the first cleaning composition may comprise, consist of, or consist essentially of: (i) at least one corrosion inhibitor, at least one etchant source, at least one passivating agent, and water; (ii) at least one corrosion inhibitor, at least one etchant source, at least one passivating agent, water, and at least one organic solvent; (iii) at least one corrosion inhibitor, at least one etchant source, at least one passivating agent, water, and at least one oxidizing agent; (iv) at least one corrosion inhibitor, at least one etchant source, at least one passivating agent, water, at least one organic solvent, and at least one oxidizing agent; (v) at least one corrosion inhibitor, at least one etchant source, at least one passivating agent, water, and at least one buffering species; (vi) at least one non-ionic surfactant corrosion inhibitor, at least one etchant source, at least one passivating agent, and water; (vii) at least one non-ionic surfactant corrosion inhibitor, at least one etchant source, at least one passivating agent, water, and at least one organic solvent; (viii) at least one non-ionic surfactant corrosion inhibitor, at least one etchant, source, at least one passivating agent, water, and at least one oxidizing agent; (ix) at least one non-ionic surfactant corrosion inhibitor, at least one etchant source, at least one passivating agent, water, at least one organic solvent, and at least one oxidizing agent; (x) at least one non-ionic surfactant corrosion inhibitor, at least one etchant source, at least one passivating agent, water, and at least one buffering species. The pH range of the first cleaning composition is 4-14, preferably about 6 to about 14, even more preferably about 6 to about 10 or about 8 to about 13.

The water is included to serve as a solvent and assist in the dissolution of residues, e.g., water-soluble copper oxide residues. The water is preferably deionized.

In a preferred embodiment, the first cleaning composition is substantially devoid of chemical mechanical polishing abrasive material prior to contact with the substrate to be cleaned.

The etchant sources assist in breaking up and solubilizing the post-etch residue species, aiding in polymer sidewall residue removal. Etchant sources contemplated herein include, but are not limited to: hydrofluoric acid (HF); fluorosilicic acid ($H_2SiF_6$); fluoroboric acid; ammonium fluorosilicate salt (($NH_4$)$_2SiF_6$); tetramethylammonium hexafluorophosphate; ammonium fluoride; ammonium bifluoride; quaternary ammonium tetrafluoroborates and quaternary phosphonium tetrafluoroborates having the formula NR$_4$BF$_4$ and PR$_4$BF$_4$, respectively, wherein R may be the same as or different from one another and is selected from the group consisting of hydrogen, straight-chained, branched, or cyclic C$_1$-C$_6$ alkyl (e.g., methyl, ethyl, propyl, butyl, pentyl, hexyl), and straight-chained or branched C$_6$-C$_{10}$ aryl (e.g., benzyl); tetrabutylammonium tetrafluoroborate (TBA-BF$_4$); and combinations thereof. Preferably, the etchant source comprises ammonium fluoride, ammonium bifluoride, quaternary ammonium tetrafluoroborates (e.g., tetramethylammonium tetrafluoroborate, tetraethylammonium tetrafluoroborate, tetrapropylammonium tetrafluoroborate, tetrabutylammonium tetrafluoroborate), quaternary phosphonium tetrafluoroborates, or combinations thereof. Preferably, the etchant source comprises ammonium bifluoride, ammonium fluoride, or a combination thereof. It should be appreciated by the skilled artisan that quaternary ammonium tetrafluoroborates and quaternary phosphonium tetrafluoroborates may be generated in situ.

The metal corrosion inhibitors serve to eliminate over-etching of metals, e.g., copper, tungsten, and/or cobalt interconnect metals. Preferred corrosion inhibitors include non-ionic surfactants such as PolyFox PF-159 (OMNOVA Solutions), polyethylene glycol) ("PEG"), poly(propylene glycol) ("PPG"), ethylene oxide/propylene oxide block copolymers such as Pluronic F-127 (BASF), a polysorbate polyoxyethylene (20) sorbitan monooleate (Tween 80), polyoxyethylene (20) sorbitan monostearate (Tween 60), polyoxyethylene (20) sorbitan monopalmitate (Tween 40), polyoxyethylene (20) sorbitan monolaurate (Tween 20)), polyoxypropylene/polyoxyethylene block copolymers (e.g., Pluronic L31, Plutonic 31R1, Pluronic 25R2 and Pluronic 25R4), and combinations thereof. In addition to at least one non-ionic surfactant, at least one additional corrosion inhibitor can be added, including, but are not limited to, azoles such as 5-aminotetrazole, 5-phenyl-benzotriazole, 1H-tetrazole-5-acetic acid, 1-phenyl-2-tetrazoline-5-thione, benzimidazole, methyltetrazole, Bismuthiol I, cytosine, guanine, thymine, pyrazoles, iminodiacetic acid (IDA), propanethiol, benzohydroxamic acids, citric acid, ascorbic acid, 5-amino-1,3,4-thiadiazole-2-thiol (ATDT), benzotriazole (BTA), 1,2,4-triazole (TAZ), tolyltriazole, 5-methyl-benzotriazole (mBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole (3-ATA), 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-amino-1,2,4-triazole (5-ATA), sodium dedecyl sulfate (SDS), ATA-SDS, 3-amino-5-mercapto-1,2,4-triazole, pentylenetetrazole, 5-phenyl-1H-tetrazole, 5-benzyl-1H-tetrazole, Ablumine O (Taiwan Surfactant), 2-benzylpyridine, succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 4-amino-4H-1,2,4-triazole, 3-amino-5-methylthio-1H-1,2,4-triazole, benzothiazole, imidazole, indiazole, adenine, succinimide, adenosine, carbazole, saccharin, uric acid, benzoinoxime, cationic quaternary salts (e.g., benzalkonium chloride, benzyldimethyldodecylammonium chloride, myristyltrime thylammonium bromide, dodecyltrimethylammonium bromide, hexadecylpyridinium chloride, Aliquot 336 (Cognis), benzyldimethylphenylammonium chloride, Crodaquat TES (Croda. Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzylditnethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldime thylammonium bromide, dodecyltrimethylammonium chloride, ethylhexadecyldimethylammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate. 1-decyl-3-methylimidazolium chloride, tridodecylmethylammonium bromide, dimethyldistearylammonium chloride, cetyltrimethylammonium bromide, myristyltrimethylammonium bromide, and hexamethonium chloride), anionic surfactants (e.g., dodecylbenzenesulfonic acid, sodium dodecylbenzenesulfonate, dodecylphosphonic acid (DDPA), and combinations thereof). It will be obvious to those skilled in the art that, while quaternary salts are available commercially most often as chlorides or bromides, it is easy to ion-exchange the halide anion with non-halide anions such as sulfate, methanesulfonate, nitrate, hydroxide, etc. Suitable tungsten corrosion inhibitors that could also be added, include, but are not limited to, sulfolane, 2-mercaptothiazoline, 2,3,5-trimethylpyrazine, 2-ethyl-3,5-dimethylpyrazine,, quinoxaline, acetyl pyrrole, pyridazine, histadine, pyrazine, glycine, benzimidazole, benzotriazole (BTA.), iminodiacetic acid (IDA), glutathione (reduced), cysteine, 2-mercaptobenzimidazole, cystine, thiophene, mercapto pyridine N-oxide, thiamine HCl, tetraethyl thiuram disulfide, 1,2,4-triazole, 2,5-dimercapto-1,3-thiadiazoleascorbic acid, ascorbic acid, and combinations thereof preferably sulfolane, pyrazine, glycine, histidine, ascorbic acid, and combinations thereof. In a particularly preferred embodiment, polysorbates (e.g., Tween 80/60/40/20) are included in the first cleaning composition, and azoles (e.g., 5-ATA, 3-ATA) and DDPA or a combination thereof can be further included.

The low-k passivating agents may be included to reduce the chemical attack of the low-k layers and to protect the wafer from additional oxidation. Boric acid is a presently preferred low-k passivating agent, although other hydroxyl additives may also be advantageously employed for such purpose, e.g., 3-hydroxy-2-naphthoic acid, malonic acid, iminodiacetic acid, ammonium pentaborate, urea, methyltriethoxysilane and mixtures thereof. Preferably, the low-k passivating agent comprises iminodiacetic acid, boric acid, or a combination thereof. When present, the composition includes at least 0.01 wt % low-k passivating agent, preferably at least 0.1% based on the total weight of the composition, Preferably, less than 2 wt. % of the underlying low-k material is etched/removed using the removal compositions described herein, more preferably less than 1 wt.

%, most preferably less than 0.5 wt. %, based on the total weight of the underlying low-k material.

The organic solvents, when present, assist in solubilization of the components of the aqueous cleaning composition and organic residues, wet the surface of the microelectronic device structure to facilitate residue removal, prevent residue redeposition, and/or passivate the underlying materials, e.g., ULK. Organic solvents contemplated herein include, but are not limited to, alcohols, ethers, pyrrolidinones, glycols, amines, and glycol ethers, including, but not limited to, methanol, ethanol, isopropanol, butanol, and higher alcohols (such as $C_2$-$C_4$ diols and $C_2$-$C_4$ triols), tetrahydrofurfuryl alcohol (THFA), halogenated alcohols (such as 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, 2-chloroethanol), dichloromethane, chloroform, acetic acid, propionic acid, trifluoroacetic acid, tetrahydrofuran N-methylpyrrolidinone (NMP), cyclohexylpyrrolidinone, N-octylpyrrolidinone, N-phenylpyrrolidinone, methyldiethanolamine, methyl formate, dimethyl formamide (DMF), dimethylsulfoxide (DMSO), tetramethylene sulfone (sulfolane), diethyl ether, phenoxy-2-propanol (PPh), propriophenone, ethyl lactate, ethyl acetate, ethyl benzoate, acetonitrile, acetone, ethylene glycol, propylene glycol (PG), 1,3-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, dipropylene glycol methyl ether acetate, tetraethylene glycol dimethyl ether (TEGDE), dibasic ester, glycerine carbonate, N-formyl morpholine, triethyl phosphate, and combinations thereof. In addition, the organic solvent may comprise other amphiphilic species, i.e., species that contain both hydrophilic and hydrophobic moieties similar to surfactants. Hydrophobic properties may generally be imparted by inclusion of a molecular group consisting of hydrocarbon or fluorocarbon groups and the hydrophilic properties may generally be imparted by inclusion of either ionic or uncharged polar functional groups. Preferably, the organic solvent includes tripropylene glycol methyl ether (TPGME), dipropylene glycol methyl ether (DPGME), propylene glycol, and combinations thereof. When present, the composition includes about 0.01 wt % to about 20 wt % organic solvent, preferably 5 wt % to 20 wt %, based on the total weight of the composition.

Buffering species contemplated include phosphate salts (e.g., diammonium hydrogen phosphate, ammonium dihydrogen phosphate, ammonium phosphate) and quaternary ammonium hydroxides having the formula $NR^1R^2R^3R^4OH$, where $R^1$, $R^2$, $R^3$ and $R'$ are the same as or different from one another and are selected from the group consisting of $C_1$-$C_6$ alkyls, $C_6$-$C_{10}$ aryls, and combinations thereof (e.g., tetraethylammonium hydroxide (TEAH), tetramethylammonium hydroxide (TMAH), tetrapropylammonium hydroxide (TPAH), tetrabutylammonium hydroxide (TBAH), tributylmethylammonium hydroxide (TBMAH), benzyltrimethylammonium hydroxide (BTMAH)). When present, the composition includes about 0.1 wt % to about 20 wt % buffering species, based on the total weight of the composition.

Oxidizing agents, when present, include, but are not limited to, hydrogen peroxide ($H_2O_2$), $FeCl_3$, $FeF_3$, $Fe(NO_3)_3$, $Sr(NO_3)_2$, $CoF_3$, $MnF_3$, ozone ($2KHSO_5 \cdot KHSO_4 \cdot K7SO_4$), periodic acid, iodic acid, vanadium (V) oxide, vanadium (IV,V) oxide, ammonium vanadate, ammonium polyatomic salts (e.g., ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_4$), ammonium persulfate (($NH_4)_2S_2O_8$), ammonium hypochlorite ($NH_4ClO$)), ammonium tungstate (($NH_4)_{10}H_2(W_2O_7)$), sodium polyatotnic salts (e.g., sodium persulfate ($Na_2S_2O_8$), sodium hypochlorite (NaClO), sodium perborate), potassium polyatomic salts (e.g., potassium iodate ($KIO_3$), potassium permanganate ($KMnO_4$), potassium persulfate, nitric acid ($HNO_3$), potassium persulfate ($K_2S_2O_8$), potassium hypochlorite (KClO)), tetramethyl ammonium polyatomic salts (e.g., tetramethylammonium chlorite ((N$(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetratnethylammonium persulfate (($N(CH_3)_4)S_2O_8$)), tetrabutylammonium polyatomic salts (e.g., tetrabutylammonium peroxomonosulfate), peroxotnonosulfuric acid, ferric nitrate ($Fe(NO_3)_3$), urea hydrogen peroxide (($CO(NH_2)_2)H_2O_2$), peracetic acid ($CH_3(CO)OOH$), 1,4-benzoquinone, toluquinone, dimethyl-1,4-benzoquinone, chloranil, alloxan, N-methylmorpholine N-oxide, trimethylamine N-oxide, and combinations thereof. When present, the amount of oxidizing agent is preferably in a range from about 0.001 wt % to 1 wt %, preferably about 0.001 wt % to about 0.1 wt %.

In a particularly preferred embodiment, the first cleaning composition comprises, consists of, or consists essentially of ammonium fluoride, boric acid, dodecylphosphonic acid, and water. In another particularly preferred embodiment, the aqueous composition comprises, consists of, or consists essentially of TMAH, ammonium bifluoride, boric acid, dodecylphosphonic acid, and water. In still another particularly preferred embodiment, the aqueous composition comprises, consists of, or consists essentially of ammonium fluoride, boric acid, dodecylphosphonic acid, a polysorbate, and water. In yet another particularly preferred embodiment, the aqueous composition comprises, consists of, or consists essentially of ammonium fluoride, ammonium bifluoride, boric acid, dodecylphosphonic acid, a polysorbate, and water. The pH range of the first cleaning composition is 4 to 14, preferably about 6 to about 10 even more preferably about 6 to about 10 or about 8 to about 13.

In another embodiment, the first cleaning compositions described herein further include post-plasma etch residue, wherein the post-plasma etch residue comprises residue material selected from the group consisting of titanium-containing residue, polymeric-residue, copper-containing residue, tungsten-containing residue, cobalt-containing residue, and combinations thereof. The residue material may be dissolved and/or suspended in the first cleaning compositions.

In one embodiment, the first cleaning compositions are useful for the selective removal of sidewall residue and/or post-etch residue without substantially etching patterned or blanket tungsten layers, copper layers, TiN, cobalt-containing layers and/or ULK layers. Preferably, the etch rate of TiN is less than about 1 Å min$^{-1}$, preferably less than about 0.5 Å min$^{-1}$, the etch rate of W is less than about 3 Å min$^{-1}$, preferably less than about 1 Å min$^{-1}$, and the loss of cobalt is less than 20 Å in five minutes and the etch rate of Co is less than 1 Å min$^{-1}$, preferably less than 10 Å loss in five minutes and the etch rate of Co is less than 0.5 Å min$^{-1}$, even preferably less than 5 Å loss in five minutes, and the etch rate of Co is less than 0.3 Å min$^{-1}$. Similarly, preferably the etch rate of low-k dielectric materials is less than about about 0.5 Å min$^{-1}$, preferably less than about 0.3 Å min$^{-1}$.

Advantageously, the first cleaning compositions described herein effectively remove post-plasma etch residue from the top surface, the sidewalls, and the vias and lines of the microelectronic device without compromising the ILD, capping layers, and/or the metal interconnect layers present on the device. In addition, the compositions may be used regardless of whether the trench or the via is etched first.

It will be appreciated that in general cleaning applications, it is common practice to make highly concentrated forms to be used at extreme dilutions. For example, the first cleaning compositions may be manufactured in a more concentrated form, including at least about 20 wt % water for solubility purposes, and thereafter diluted with additional solvent (e.g., water and/or organic solvent) at the manufacturer, before use, and/or during use at the fab. Dilution ratios may be in a range from about 0.1 part diluent:1 part removal composition concentrate to about 100 parts diluent:1 part removal composition concentrate. It is understood that upon dilution, the weight percent ratios of many of the components of the removal composition will remain unchanged.

The first cleaning compositions described herein are easily formulated by simple addition of the respective ingredients and mixing to homogeneous condition. Furthermore, the compositions may be readily formulated as single-package formulations or multi-part formulations that are mixed at the point of use, preferably multi-part formulations. The individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit including, in one or more containers, one or more components adapted to form the first cleaning compositions described herein. Preferably, the kit includes, in one or more containers, the preferred combination of at least one corrosion inhibitor, at least one etchant source, at least one passivating agent, water, optionally at least one organic solvent, optionally at least one buffering species, and optionally at least one oxidizing agent, for combining with water at the fab or the point of use. The containers of the kit must be suitable for storing and shipping said cleaning composition components, for example, NOWPak® containers (Advanced Technology Materials, Inc., Danbury, Conn., USA). The one or more containers which contain the components of the first cleaning composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended cleaning composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and U.S. Patent Application No. 60/916,966 entitled "SYSTEMS AND METHODS FOR MATERIAL BLENDING AND DISTRIBUTION" filed on May 9, 2007 in the name of John E. Q. Hughes, and PCT/US08/63276 entitled "SYSTEMS AND METHODS FOR MATERIAL BLENDING AND DISTRIBUTION" filed on May 9, 2008 in the name of Advanced Technology Materials, Inc.

As applied to microelectronic manufacturing operations, the first cleaning compositions are usefully employed to clean post-plasma etch residue from the surface of the microelectronic device, and may be applied to said surface before or after the application of other compositions formulated to remove alternative materials from the surface of the device. The first cleaning compositions described herein do not damage ultra low-k (ULK) ILD materials, the metallic interconnect materials, the hardmask capping layers, and cobalt capping layers, on the microelectronic device surface and preferably remove at least 90% of the residue present on the device prior to removal processing, more preferably at least 95 and most preferred at least 99% of the residue to be removed is removed.

In post-plasma etch residue removal application, the first cleaning composition may be applied in any suitable manner to the device to be cleaned, e.g., by spraying the composition on the surface of the device to be cleaned, by dipping the device to be cleaned in a static or dynamic volume of the composition, by contacting the device to be cleaned with another material, e.g., a pad, or fibrous sorbent applicator element, that has the composition absorbed thereon, or by any other suitable means, manner or technique by which the composition is brought into removal contact with the device to be cleaned. Further, batch or single wafer processing is contemplated herein.

In a third aspect, the first cleaning compositions are used for removing post-plasma etch residue from microelectronic devices having same thereon, the first cleaning composition typically is statically or dynamically contacted with the device for a time of from about 1 minute to about 30 minutes, preferably about 1 minute to 10 minutes, at temperature in a range of from about 20° C. to about 90° C., preferably about 40° C. to about 70° C., and most preferably about 50° C. to about 60° C. Preferably, the contacting is static. Such contacting times and temperatures are illustrative, and any other suitable time and temperature conditions may be employed that are efficacious to at least partially remove the post-etch residue material from the device. "At least partial removal" of the residue material from the microelectronic device corresponds to at removal of at least 90% of the material, preferably at least 95% removal. Most preferably, at least 99% of said residue material is removed using the first cleaning compositions described herein.

Following the achievement of the desired removal action, the first cleaning compositions may be readily removed from the device to which it has previously been applied, e.g., by rinse, wash, or other removal step(s), as may be desired and efficacious in a given end use application of the compositions described herein. For example, the device may be rinsed with a rinse solution including deionized water and/or dried (e.g., spin-dry, $N_2$, vapor-dry etc.

When necessary, a post-clean bake step and/or an isopropanol vapor-dry step may be necessary to remove non-volatile materials that may absorb into the pores of the ILD materials so as not to change the capacitance of the low-k dielectric materials.

In a fourth aspect, a method of removing material from a microelectronic device having said material thereon, said method comprising contacting the microelectronic device with a second cleaning composition for sufficient time to at least partially remove said material from the microelectronic device, wherein the second cleaning composition includes at least one etchant, at least one metal inhibitor, at least one organic solvent, water, and optionally at least one passivating agent. The second cleaning compositions are usefully employed to clean post-plasma etch residue from the surface of the microelectronic device, and may be applied to said surface before or after the application of other compositions formulated to remove alternative materials from the surface of the device. The second cleaning compositions described herein do not damage ultra low-k (ULK) ILD materials, the metallic interconnect materials, the hardmask capping layers, and cobalt capping layers, on the microelectronic device surface and preferably remove at least 90% of the residue present on the device prior to removal processing, more preferably at least 95%, and most preferred at least 99% of the residue to be removed is removed.

In post-plasma etch residue removal application, the second cleaning composition may be applied in any suitable manner to the device to be cleaned, e.g., by spraying the composition on the surface of the device to be cleaned, by dipping the device to be cleaned in a static or dynamic volume of the composition, by contacting the device to be cleaned with another material, e.g., a pad, or fibrous sorbent applicator element, that has the composition absorbed thereon, or by any other suitable means, manner or technique by which the composition is brought into removal contact with the device to be cleaned. Further, batch or single wafer processing is contemplated herein.

The second cleaning composition typically is statically or dynamically contacted with the device for a time of from about 1 minute to about 30 minutes, preferably about 1 minute to 10 minutes, at temperature in a range of from about 20° C. to about 90° C., preferably about 40° C. to about 70° C., and most preferably about 50° C. to about 60° C. Preferably, the contacting is static. Such contacting times and temperatures are illustrative, and any other suitable time and temperature conditions may be employed that are efficacious to at least partially remove the post-etch residue material from the device. "At least partial removal" of the residue material from the microelectronic device corresponds to at removal of at least 90% of the material, preferably at least 95% removal. Most preferably, at least 99% of said residue material is removed using the second cleaning compositions described herein.

Following the achievement of the desired removal action, the second cleaning compositions may be readily removed from the device to which it has previously been applied, e.g., by rinse, wash, or other removal step(s), as may be desired and efficacious in a given end use application of the compositions described herein. For example, the device may be rinsed with a rinse solution including deionized water and/or dried (e.g., spin-dry, $N_2$, vapor-dry etc.).

The second cleaning compositions comprise, consist of, or consist essentially of at least one etchant, at least one metal inhibitor, at least one organic solvent, water, and optionally at least one passivating agent, present in the following amounts based on the total weight of the composition:

|  | preferably | more preferably |
| --- | --- | --- |
| etchant(s) | about 0.01 wt % to about 10 wt % | about 0.01 wt % to about 2 wt % |
| metal inhibitor(s) | about 0.01 wt % to about 10 wt % | about 0.01 wt % to about 2 wt % |
| organic solvent(s) | about 30 wt % to about 75 wt % | about 50 wt % to about 70 wt % |
| water | about 5 wt % to about 70 wt % | about 26 wt % to about 50 wt % |
| passivating agent(s) | 0 to about 10 wt % | 0.01 wt % to about 5 wt % |

The components for the second cleaning compositions are the same as those described hereinabove for the first cleaning composition. Preferably, the at least one etchant comprises ammonium bifluoride, TBA-$BF_4$, or a combination thereof. Preferably, the at least one metal inhibitor comprises ATDT, TAZ, benzalkonium chloride, mercaptobenzothiazole, 5-ATA, or a combination thereof, most preferably a combination of ATDT and TAZ or 5-ATA. Preferably, the at least one organic solvent comprises TPGME with TEGDE or DPGME.

hi a preferred embodiment, the second cleaning composition is substantially devoid of abrasive or other inorganic particulate material, amines, chlorides ($Cl^-$), metal halides, silicates, and combinations thereof. The pH of the second cleaning composition of the second aspect is preferably in a range from about 3 to about 8, preferably about 6 to about 8.

Another aspect relates to the improved microelectronic devices made according to the methods described herein and to products containing such microelectronic devices.

A still further aspect relates to methods of manufacturing an article comprising a microelectronic device, said method comprising contacting the microelectronic device with a composition for sufficient time to clean post-plasma etch residue from the microelectronic device having said residue thereon, and incorporating said microelectronic device into said article, wherein the composition can be the first or second cleaning composition described herein.

A still further aspect relates to methods of manufacturing an article comprising a microelectronic device, said method comprising contacting the microelectronic device with a composition for sufficient time to clean post-plasma etch residue from the microelectronic device having said residue thereon, and incorporating said microelectronic device into said article, wherein the composition can be the first or second cleaning composition described herein.

In yet another aspect, the first or second cleaning compositions described herein may be utilized in other aspects of the microelectronic device manufacturing process, i.e., subsequent to the post-plasma etch residue cleaning step. For example, the compositions may be used to remove post-ash residue and/or they may he diluted and used as a post-chemical mechanical polishing (CMP) clean.

In yet another aspect, an article of manufacture is described, said article comprising a microelectronic device substrate, residue material, and a cleaning composition, wherein the cleaning composition can be the first or second cleaning composition described herein, and wherein the residue material is selected from the group consisting of titanium-containing residue, polymeric-residue, copper-containing residue, tungsten-containing residue, cobalt-containing residues, and combinations thereof.

Although the invention has been variously disclosed herein with reference to illustrative embodiments and features, it will he appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. An aqueous cleaning composition for titanium nitride (TiN) substrate, comprising from about 0.5 wt % to about 10 wt % of at least one non-ionic surfactant corrosion inhibitor, from about 0.01 wt % to about 10 wt % at least one etchant source, from about 0.01 wt % to about 10 wt % of at least one passivating agent, wherein the at least one passivating agent comprises boric acid, from about 50 wt % to about 99.5 wt % water, from about 5 wt % to about 20 wt % of at least one organic solvent, dodecylphosphonic acid (DDPA), optionally from about 0 wt % to about 20 wt % of at least one buffering species, optionally from about 0 wt % to about 10 wt % of at least one additional corrosion inhibitor other than dodecylphosphonic acid (DDPA), and optionally from about 0 wt % to about 1 wt % of at least one oxidizing agent, wherein said aqueous cleaning composition has a pH in a range from about 8 to about 13 and is suitable for cleaning post-plasma etch residue from the TiN substrate having said residue thereon, wherein the at least one non-ionic surfactant corrosion inhibitor comprises a species selected from the group consisting of ethylene oxide/propylene oxide block copolymers, a polysorbate, polyoxypropylene/ polyoxyethylene block copolymers, and combinations thereof, and wherein post plasma etch residue cleaning has an TiN etch rate of less than about 1 Å min$^{-1}$.

2. The cleaning composition of claim 1, wherein the post-plasma etch residue comprises residue selected from the group consisting of titanium-containing compounds, polymeric compounds, copper-containing compounds, tungsten-containing compounds, cobalt-containing compounds and combinations thereof.

3. The cleaning composition of claim 1 wherein the at least one etchant comprises a fluoride species selected from the group consisting of hydrofluoric acid, fluoroboric acid, tetramethylammonium hexafluorophosphate, ammonium fluoride, ammonium bifluoride, tetrabutylammonium tetrafluoroborate, tetramethylammonium tetrafluoroborate, tetraethylammonium tetrafluoroborate, tetrapropylammonium tetrafluoroborate, tetrabutylammonium tetrafluoroborate, and combinations thereof.

4. The cleaning composition of claim 3, wherein the at least one etchant comprises a fluoride selected from the group consisting of ammonium bifluoride, ammonium fluoride, and combinations thereof.

5. The cleaning composition of claim 1, wherein the at least one non ionic surfactant corrosion inhibitor comprises a polysorbate.

6. The cleaning composition of claim 5, wherein the at least one nonionic surfactant corrosion inhibitor comprises polyoxyethylene sorbitan monooleate, polyoxyethylene sorbitan monostearate, polyoxyethylene sorbitan monopalmitate, polyoxyethylene sorbitan monolaurate.

7. The cleaning composition of claim 1, comprising at least one additional corrosion inhibitor selected from the group consisting of 5-aminotetrazole, 5-phenyl benzotriazole, 1H-tetrazole-5-acetic acid, 1-phenyl-2-tetrazoline-5-thione, benzimidazole, methyltetrazole, Bismuthiol I, cytosine, guanine, thymine, pyrazoles, iminodiacetic acid (IDA), propanethiol, benzohydroxamic acids, citric acid, ascorbic acid, 5-amino-1,3,4- thiadiazole-2-thiol (ATDT), benzotriazole (BTA), 1,2,4-triazole (TAZ), tolyltriazole, 5-methylbenzotriazole (mB TA), 5-phenyl-benzotriazole, 5-nitrobenzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole (3-ATA), 3-mercapto-1,2,4-triazole, 3-isopropyl -1,2,4-triazole, 5-phenylthiol-benzotriazole, halo-benzotriazoles, naphthotriazole, 2-mercaptobenzimidazole (MBI), 2-mercaptobenzothiazole, 4-methyl-2-phenylimidazole, 2-mercaptothiazoline, 5-amino-1,2,4-triazole (5-ATA), sodium dedecyl sulfate (SDS), ATA-SDS, 3-amino-5-mercapto-1,2,4-triazole, pentylenetetrazole, 5-phenyl-1H-tetrazole, 5-benzyl-1H -tetrazole, Ablumine 0,2-benzylpyridine, succinimide, 2,4-diamino-6-methyl-1,3, 5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 4-amino-4H-1,2, 4-triazole, 3-amino-5-methylthio -1H-1,2,4-triazole, benzothiazole, imidazole, indiazole, adenine, succinimide, adenosine, carbazole, saccharin, uric acid, and benzoin oxime. benzalkonium chloride, benzyldimethyldodecylammoniuni chloride, myristyltrimethylammonium bromide, dodecyltrimethylammonium bromide, hexadecylpyridinium chloride, benzyldimethylphenylammonium chloride, hexadecyltrimethylammonium p-toluenesulfonate, hexadecyltrimethylammonium hydroxide, 1-methyl-l'-tetradecyl-4,4'-bipyridium dichloride, alkyltrimethylammonium bromide, amprolium hydrochloride, benzethonium hydroxide, benzethonium chloride, benzyldimethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldimethylammonium bromide, dodecyltrimethylammonium chloride, ethylhexadecyldimethylammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, N,N',N'-polyoxy ethylene(10)-N-tallow-1,3-diaminopropane liquid, oxyphenonium bromide, tetraheptylammonium bromide, tetrakis (decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate, 1-decyl-3-methylimidazolium chloride, tridodecylmethylammonium bromide, dimethyldistearylammonium chloride, cetyltrimethylammonium bromide, myristyltrimethylammonium bromide, hexamethonium chloride, dodecylbenzenesulfomc acid, sodium dodecylbenzenesulfonate, and combinations thereof.

8. The cleaning composition of claim 1, wherein the composition is substantially devoid of abrasive material and alkali and alkaline earth metal hydroxide salts.

9. The cleaning composition of claim 1, wherein the at least one buffering species is a phosphate salt or a quaternary ammonium hydroxide having the formula $NR^1R^2R^3R^4OH$, where $R^1$, $R^2$, and $R^4$ are the same as or different from one another and are selected from the group consisting of $C_1$-$C_6$ alkyls, $C_6$-$C_{10}$ aryls, and combinations thereof.

10. The cleaning composition of claim 1, wherein the composition further comprises at least one oxidizing agent.

11. The cleaning composition of claim 1, wherein said composition further comprises post-plasma etch residue selected from the group consisting of titanium-containing residue, polymeric-residue, copper-containing residue, tungsten-containing residue, cobalt-containing residue, and combinations thereof.

12. A method of removing material from a microelectronic device having said material thereon, said method comprising contacting the microelectronic device with an aqueous cleaning composition of claim 1 for sufficient time to at least partially remove said material from the microelectronic device.

13. The method of claim 12, wherein the material comprises post-plasma etch residue comprising residue selected from the group consisting of titanium-containing compounds, polymeric compounds, copper-containing compounds, tungsten-containing compounds, cobalt-containing compounds, and combinations thereof.

* * * * *